(12) United States Patent
Ishibashi

(10) Patent No.: US 8,780,583 B2
(45) Date of Patent: Jul. 15, 2014

(54) PRINTED WIRING BOARD AND ELECTRONIC DEVICE

(75) Inventor: Hiroyuki Ishibashi, Osaka (JP)

(73) Assignee: Funai Electric Co., Ltd., Osaka (JP)

(*) Notice: Subject to any disclaimer, the term of this patent is extended or adjusted under 35 U.S.C. 154(b) by 235 days.

(21) Appl. No.: 13/413,404

(22) Filed: Mar. 6, 2012

(65) Prior Publication Data

US 2012/0228003 A1 Sep. 13, 2012

(30) Foreign Application Priority Data

Mar. 11, 2011 (JP) ................................. 2011-054796

(51) Int. Cl.
H05K 7/02 (2006.01)
H05K 7/04 (2006.01)

(52) U.S. Cl.
USPC .......................................... 361/810; 361/748

(58) Field of Classification Search
USPC ........................... 361/720, 736, 748, 760, 803
See application file for complete search history.

(56) References Cited

U.S. PATENT DOCUMENTS

| 4,336,419 | A  | * | 6/1982  | Wakayama et al. | 174/261 |
| 4,455,715 | A  | * | 6/1984  | Matsui          | 24/16 PB |
| 6,399,893 | B1 | * | 6/2002  | Terashima       | 174/260 |
| 6,713,685 | B1 | * | 3/2004  | Cotton          | 174/262 |
| 6,775,151 | B2 | * | 8/2004  | Suzuki          | 361/788 |
| 7,147,480 | B2 | * | 12/2006 | Ikeda           | 439/67  |
| 7,645,943 | B2 | * | 1/2010  | Horiuchi        | 174/261 |
| 7,670,186 | B2 | * | 3/2010  | Ting et al.     | 439/630 |

FOREIGN PATENT DOCUMENTS

| JP | 10-178283 A    | 6/1998 |
| JP | 2002-158421 A  | 5/2002 |

* cited by examiner

Primary Examiner — Hung S Bui
(74) Attorney, Agent, or Firm — Global IP Counselors, LLP

(57) ABSTRACT

A printed wiring board has an aperture with a continuous peripheral face. The aperture has a mounting hole portion and an insertion hole portion. The mounting hole portion is disposed adjacent to a side edge of the printed wiring board. The insertion hole portion is disposed between the mounting hole portion and the side edge of the printed wiring board. The insertion hole portion is spaced apart from the side edge of the printed wiring board by a distance that is at least equal to a thickness of the printed wiring board.

14 Claims, 3 Drawing Sheets

PRINTED WIRING BOARD AND ELECTRONIC DEVICE

CROSS-REFERENCE TO RELATED APPLICATIONS

This application claims priority to Japanese Patent Application No. 2011-054796 filed on Mar. 11, 2011. The entire disclosure of Japanese Patent Application No. 2011-054796 is hereby incorporated herein by reference.

BACKGROUND

1. Field of the Invention

The present invention generally relates to a printed wiring board. More specifically, the present invention relates to a printed wiring board having a mounting hole for a mounted member.

2. Description of the Related Art

With a conventional printed wiring board, a shield case or other such mounted member is disposed along an edge of the printed wiring board. When an insertion hole is formed for a cable tie that clamps a wire assembly provided along the edge of the printed wiring board, the insertion hole for inserting the cable tie are formed between the edge of the printed wiring board and a mounting hole for the mounted member that is formed near the edge of the printed wiring board.

Meanwhile, with another conventional printed wiring board, a recessed patternless part having a substantially U-shaped plan view is formed in a pattern on the printed wiring board. Furthermore, a through hole having a convex shape in plan view is formed in the patternless part. A distal end portion of the through hole protrudes into the patternless part. A signal-monitoring rod provided with a plurality of spring wires at its lower end is inserted into a wide part of the through hole of the printed wiring board. Then, the signal-monitoring rod is moved to the distal end portion of the through hole to bring the spring wires into contact with test points of the pattern, which affords a simple way to monitor a signal (see Japanese Laid-Open Patent Application Publication No. 2002-158421, for example).

With further another conventional printed wiring board, a through hole is formed in the printed wring board. The through hole has an inside diameter that is larger than an outside diameter of an element formed at a distal end of a core wire of a cord. Furthermore, a slot hole is formed continuously with this through hole. The slot hole has a groove width that is greater than the outside diameter of the core wire. The element at the distal end of the core wire of the cord is inserted into the through hole. The core wire is moved to the slot hole. Then, the element is soldered on a rear face on the slot hole side. This ensures a secure connection such that the element will not come loose even if tensile force is applied to the cord (see Japanese Laid-Open Patent Application Publication No. H10-178283, for example).

SUMMARY

With the conventional printed wiring board, the insertion hole for inserting the cable tie for the wire assembly is formed between the edge of the printed wiring board and the mounting hole for mounting the mounted member. When the mounted member is formed near the edge of the printed wiring board, then the distance from the mounting hole for the mounted member to the edge of the printed wiring board becomes shorter. In this case, it has been discovered that the distance from the mounting hole to the insertion hole, or the distance from the insertion hole to the edge of the printed wiring board becomes less than a thickness of the printed wiring board. Furthermore, it has also been discovered that if the above-mentioned distances are less than the thickness of the printed wiring board, then there is the risk that a crack will form in the printed wiring board. Specifically, it has been discovered that when the mounting hole or the insertion hole is made with a die, there is the risk that a crack will form in a board portion between the mounting hole and the insertion hole, or in a board portion from the insertion hole to the edge of the printed wiring board. This can lead to the breakage of the printed wiring board.

The above problem cannot be solved with the conventional printed wiring boards. Specifically, with one of the above-mentioned conventional printed wiring boards, the though hole having the convex shape in plan view is formed in the printed wiring board merely for the purpose of allowing simple monitoring of a signal. Furthermore, with the other of the above-mentioned conventional printed wiring boards, the though hole and the slot hole are formed continuously in the printed wiring board merely for the purpose of maintaining the secure connection with the core wire of the cord.

An improved printed wiring board was conceived in light of the above-mentioned problem. One object of the present disclosure is to provide a printed wiring board with which there is less risk of board breakage even when the printed wiring board has a mounting hole for mounting a mounted member and an insertion hole for a cable tie.

In accordance with one aspect of the present disclosure, a printed wiring board has an aperture with a continuous peripheral face. The aperture has a mounting hole portion and an insertion hole portion. The mounting hole portion is disposed adjacent to a side edge of the printed wiring board. The insertion hole portion is disposed between the mounting hole portion and the side edge of the printed wiring board. The insertion hole portion is spaced apart from the side edge of the printed wiring board by a distance that is at least equal to a thickness of the printed wiring board.

These and other objects, features, aspects and advantages will become apparent to those skilled in the art from the following detailed description, which, taken in conjunction with the annexed drawings, discloses selected embodiments.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from these disclosures that the following descriptions of the embodiments are provided for illustration only and not for the purpose of limiting the invention as defined by the appended claims and their equivalents.

Figure 1:
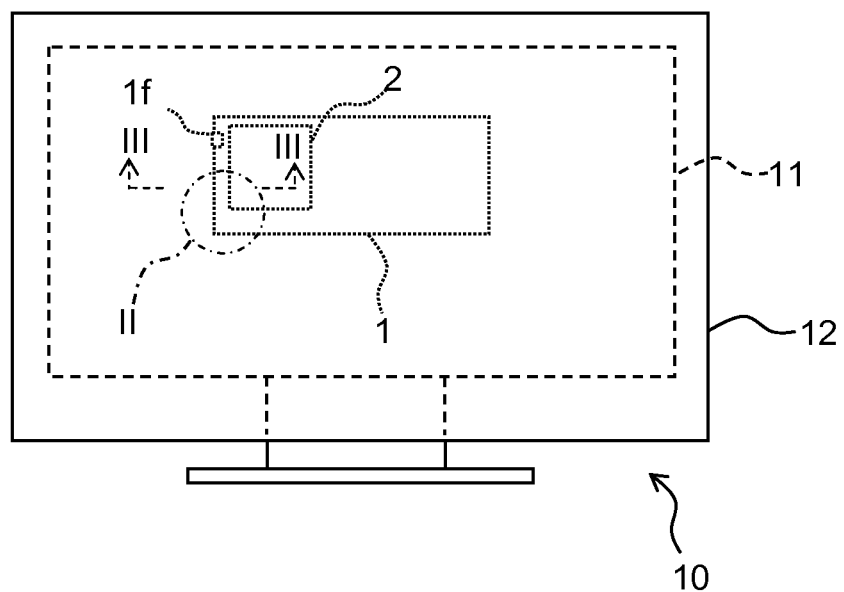
FIG. 1 is a rear elevational view of a display device having a printed wiring board in accordance with one embodiment.
Figure 2:
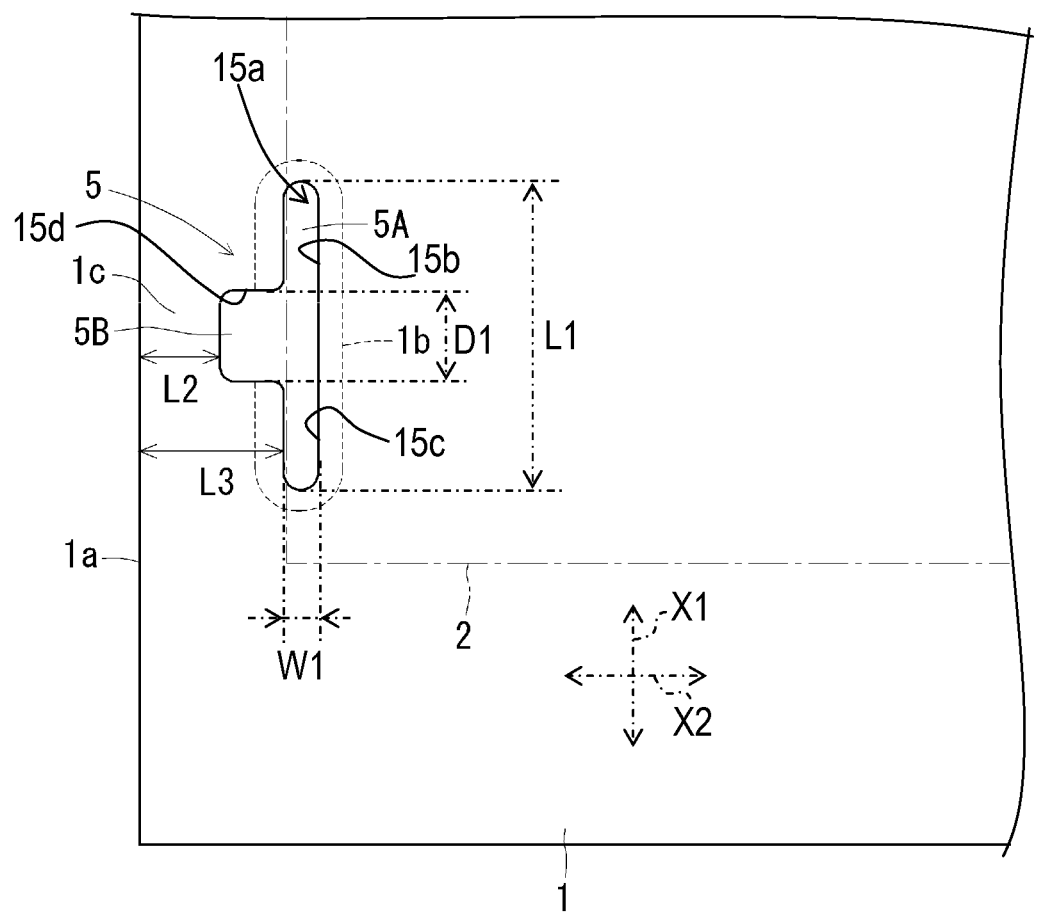
FIG. 2 is a partial, enlarged elevational view of the printed wiring board of an encircled portion II in FIG. 1, illustrating an aperture having a mounting hole for a mounted member and an insertion hole for a cable tie.
Figure 3:
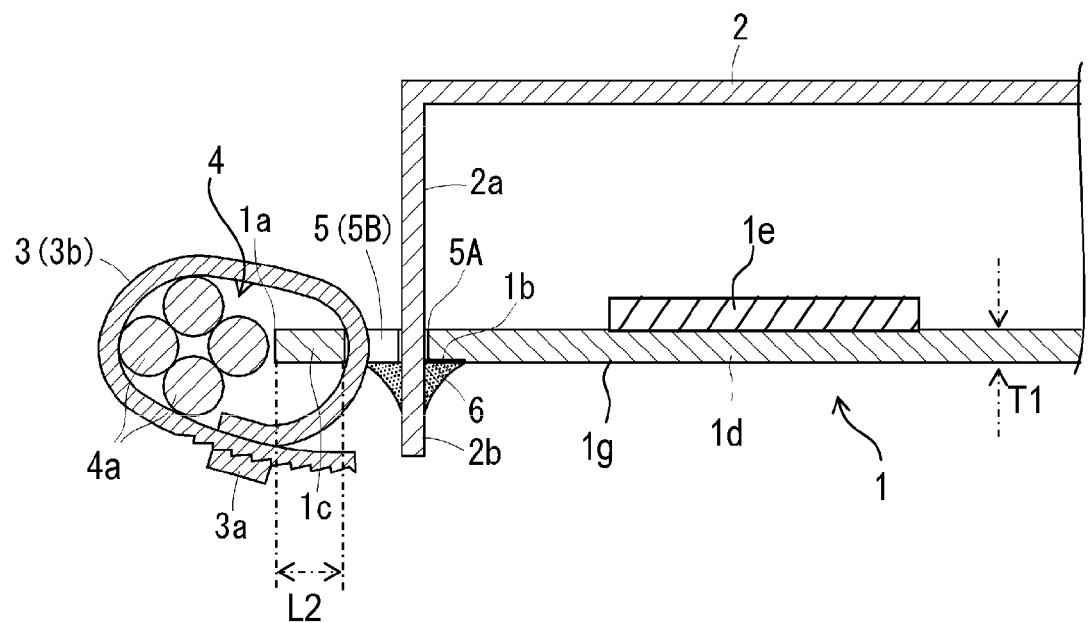
FIG. 3 is a partial cross sectional view of the display device illustrated in FIG. 1, taken along III-III line in FIG. 1, illustrating a shield case being attached to a mounting hole, and a cable tie for clamping a wire assembly being inserted through an insertion hole.

Referring to FIGS. 1 to 3, an image display device 10 (e.g., electronic device) having a printed wiring board 1 in accordance with one embodiment. As illustrated in FIG. 1, the image display device 10, such as a flat-screen liquid crystal television set, mainly includes a liquid crystal module 11 and a cabinet 12. The liquid crystal module 11 displays an image. The liquid crystal module 11 is disposed within the cabinet 12 such that the liquid crystal module 11 faces a front opening of the cabinet 12. The liquid crystal module 11 mainly includes a backlight unit, a rear frame and a liquid crystal panel. The configuration of the liquid crystal module 11 is well known. Thus, the detailed description about the liquid crystal module 11 is omitted for the sake of brevity. The backlight unit is provided inside the rear frame. The liquid crystal panel is disposed on a front face side of the rear frame.

The image display device 10 further includes the printed wiring board 1, a shield case 2 (e.g., mounted member), a cable tie 3 (e.g., coupling member) and a wire assembly 4. The printed wiring board 1 is attached to a rear face of the rear frame of the liquid crystal module 11. The shield case 2 is disposed on and attached to the printed wiring board 1. The wire assembly 4 is clamped with the cable tie 3.

The printed wiring board 1 includes a glass epoxy board 1d (e.g., board main body) that is used in a flat-screen liquid crystal television set or the like. The printed wiring board 1 is designed such that the shield case 2 is disposed along an end portion of the printed wiring board 1, and is laid out toward the end portion. The printed wiring board 1 has various electronic components 1e, a plurality of connectors 1f (only one is shown in FIG. 1), and so forth that are mounted and electrically connected to a wiring pattern of the printed wiring board 1. The shield case 2 is made of metal. The shield case 2 serves as an electromagnetic shielding for the printed wiring board 1. The shield case 2 shields against electromagnetic waves from the printed wiring board 1. The wire assembly 4 has a plurality of electric wires 4a. The wire assembly 4 is electrically connected to one of the connectors 1f, etc, or is electrically connected to other parts of the printed wiring board 1. The wire assembly 4 is provided along an edge 1a (e.g., side edge) of the printed wiring board 1, and is clamped relative to the printed wiring board 1 with the cable tie 3. In other words, the cable fixedly couples the wire assembly 4 to the printed wiring board 1.

As illustrated in FIGS. 2 and 3, the printed wiring board 1 includes an aperture 5 having an mounting hole 5A (e.g., mounting hole portion) and an insertion hole 5B (e.g., insertion hole portion). The aperture 5 has a continuous peripheral face 15a with a closed peripheral edge 15b (e.g., continuous peripheral edge) on a rear face 1g of the printed wiring board 1. Furthermore, the mounting hole 5A has a first edge 15c on the rear face 1g, and the insertion hole 5B has a second edge 15d on the rear face 1g. The first and second edges 15c and 15d form the closed peripheral edge 15b of the aperture 5. The mounting hole 5A includes an elongated slot hole (e.g., elongated opening) extending along the edge 1a of the printed wiring board 1. The mounting hole 5A is disposed adjacent to the edge 1a of the printed wiring board 1. The mounting hole 5A has a length L1 measured in a first direction X1 of the printed wiring board 1. The length L1 of the mounting hole 5A is greater than a width W1 of the mounting hole 5A measured in a second direction X2 of the printed wiring board 1. The second direction X2 is perpendicular to the first direction X1. The length L1 of the mounting hole 5A is greater than a dimension D1 of the insertion hole 5B measured in the first direction X1.

The shield case 2 is a box-shaped member having a side panel 2a. The side panel 2a further has a plug-in tab 2b (e.g., tab portion) that protrudes downward from a lower end of the side panel 2a of the shield case 2. The plug-in tab 2b is plugged into and disposed through the mounting hole 5A. In other words, the mounting hole 5A is provided for mounting the shield case 2 to the printed wiring board 1.

The insertion hole 5B includes a square hole (e.g., square opening). The insertion hole 5B is provided for inserting the cable tie 3 for clamping the wire assembly 4 relative to the printed wiring board 1. In other words, the cable tie 3 is disposed through the insertion hole 5B. The insertion hole 5B is formed joined with the mounting hole 5A at a midst position (e.g., middle portion) of the mounting hole 5A in a longitudinal direction of the mounting hole 5A that is parallel to the first direction X1 of the printed wiring board 1. The insertion hole 5B extends towards the edge 1a of the printed wiring board 1. The insertion hole 5B is disposed between the mounting hole 5A and the edge 1a of the printed wiring board 1. In other words, the aperture 5 is formed as an irregularly shaped hole having a hat-shaped plan view. The insertion hole 5B is spaced apart from the edge 1a of the printed wiring board 1 by a distance L2 that is at least equal to a thickness T1 (see FIG. 3) of the printed wiring board 1. More specifically, a portion of the second edge 15d that is closest to the edge 1a in the second direction X2 is spaced apart from the edge 1a by the distance L2.

The single aperture 5 serves as both a mounting hole for the shield case 2 and an insertion hole for the cable tie 3. Since the two holes are joined together, the insertion hole 5B for the cable tie 3 can be shifted toward the mounting hole 5A for the shield case 2. Thus, even if a distance L3 from the mounting hole 5A for the shield case 2 to the edge 1a is set to be short, the distance L2 from the insertion hole 5B for the cable tie 3 to the edge 1a can be configured such that the distance L2 is at least equal to the thickness of the printed wiring board 1.

The printed wiring board 1 further has a soldering land 1b (e.g., solder land) around an outer edge of the mounting hole 5A on the rear face 1g of the printed wiring board 1, except for a portion joined with the insertion hole 5B. Specifically, the soldering land 1b is disposed on the rear face 1g of the printed wiring board 1 along the continuous peripheral edge 15b of the aperture 5 except for a part of the second edge 15d of the insertion hole 5B that is located closest to the edge 1a of the printed wiring board 1. In other words, the soldering land 1b is disposed along at least the first edge 15c of the mounting hole 5A. The plug-in tab 2b of the shield case 2 is plugged into the mounting hole 5A, and then is soldered to this soldering land 1b. Specifically, the plug-in tab 2b is fixedly coupled to the printed wiring board 1 with a solder 6 that is applied between the soldering land 1b of the printed wiring board 1 and side faces of the plug-in tab 2b. The corners of the joined mounting hole 5A and insertion hole 5B, that is, the corners of the aperture 5, are rounded such that no cracks, etc., will form during perforation with a die.

The printed wiring board 1 has only one mounting hole 5A for the shield case 2, as illustrated in FIGS. 2 and 3. However, this mounting hole 5A can be formed at a plurality of locations near the edge 1a of the printed wiring board 1, corresponding to the number of plug-in tabs 2b on the shield case 2. Furthermore, the insertion hole 5B for the cable tie 3 can also be formed at a plurality of locations. Moreover, in this case, the insertion holes 5B do not need to be joined to all of the mounting holes 5A. At least one of the insertion holes 5B is joined to one of the mounting holes 5A.

Figure 4:
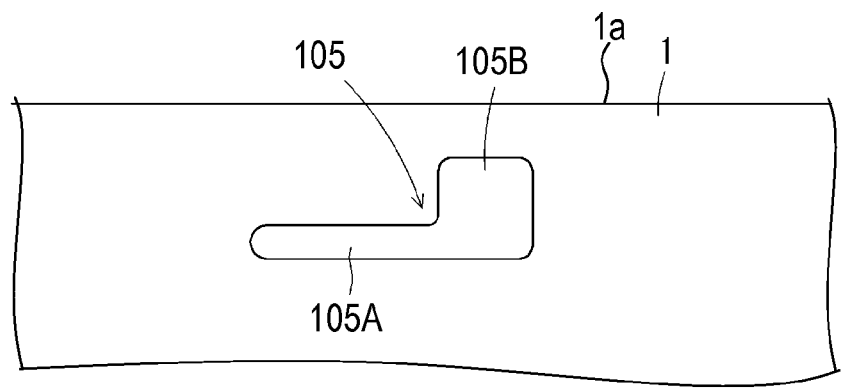
FIG. 4 is a partial, enlarged elevational view of a printed wiring board in accordance with modified embodiment, illustrating an aperture having a mounting hole for a mounted member and an insertion hole for a cable tie.

With the printed wiring board 1, the mounting hole 5A for the shield case 2 and the insertion hole 5B for the cable tie 3 are joined so as to form the hat-shaped hole (i.e., aperture 5). However, the insertion hole can be formed at different locations relative to the mounting hole. As shown in FIG. 4, an insertion hole 105B can be shifted toward either longitudinal end of a mounting hole 105A to form a hook-shaped hole (i.e., aperture 105). The mounting hole 105A is identical to the mounting hole 5A illustrated in FIG. 1, and the insertion hole 105B is identical to the insertion hole 5B illustrated in FIG. 1. The insertion hole 105B extends from an longitudinal end (e.g., end portion) of the mounting hole 105A in the first direction X1 of the printed wiring board 1 towards the edge 1a of the printed wiring board 1. Furthermore, the shape of the mounting hole 5A is not limited to that of the slot hole shown in FIG. 2. The mounting hole 5A can be formed in various shapes according to the shape of the plug-in tabs formed on the shield case 2. Moreover, the insertion hole 5B is not limited to a square shape as shown in FIG. 2. The shape of the insertion hole 5B can be formed in various shapes, such as circular or elliptical.

As shown in FIG. 3, with the printed wiring board 1, the plug-in tab 2b of the shield case 2 is plugged into the mounting hole 5A, and the plug-in tab 2b is soldered to the soldering land 1b on the rear face of the printed wiring board with the solder 6, which fixes the shield case 2 on the printed wiring board 1. The cable tie 3 is then passed through the insertion hole 5B, and the wire assembly 4 is clamped relative to the printed wiring board 1 with this cable tie 3, which fixes the wire assembly 4 along the edge 1a of the printed wiring board 1.

As shown in FIG. 3, the cable tie 3 is made of a synthetic resin. The cable tie 3 has a box part 3a and a strip 3b. The box part 3a has a serrated anti-slip engagement face on its inside. The box part 3a is provided at one end of the strip 3b. The other end of the strip 3b is inserted into the box part 3a. The serrated engagement face of this other end of the strip is engaged with the engagement face on the inside of the box part 3a. This securely clamps the wire assembly 4 relative to the printed wiring board 1. The configuration of the cable tie 3 is well known. Thus, the detailed description is omitted for the sake of brevity. Furthermore, the cable tie 3 is not the only option for a coupling member for clamping the wire assembly 4. Anything that allows the wire assembly 4 to be securely clamped can be used, such as various kinds of cord or bendable ties that flank a wire on both sides with a strip of film made from a synthetic resin, for example.

With the printed wiring board 1, the insertion hole 5B for inserting the cable tie 3 for the wire assembly 4 is formed such that it is joined with the mounting hole 5A for the shield case 2. As a result, the insertion hole 5B can be shifted toward the mounting hole 5A. In other words, the insertion hole 5B can be moved closer to the mounting hole 5A by a distance between a conventional mounting hole and a conventional insertion hole. Furthermore, the insertion hole 5B can be located farther away from the edge 1a of the printed wiring board 1 as compared to the conventional printed wiring board having independently formed holes (i.e., conventional mounting hole and conventional insertion hole). Thus, even if the mounting hole 5A is formed close to the edge 1a of the printed wiring board 1 and the distance L3 from the mounting hole 5A to the edge 1a of the printed wiring board 1 is set to be short, the distance L2 from the insertion hole 5B to the edge 1a of the printed wiring board 1 can be designed such that the distance L2 is at least equal to the thickness of the printed wiring board 1. Thus, when the mounting hole 5A and the insertion hole 5B are joined and punched out as a single irregularly shaped hole with a die, there will be less or no risk that cracks will be formed in a board portion 1c between the insertion hole 5B and the edge 1a of the printed wiring board 1 and the board breakage will be caused. Since the risk of board breakage is thus eliminated, it is possible to install the shield case 2 in a layout that is closer to the edge 1a of the printed wiring board 1, which results in greater latitude in design.

The printed wiring board 1 is used in the image display device 10. However, the printed wiring board 1 can also be used in any other electronic device. Specifically, the printed wiring board 1 can be used in other television sets, a personal computer, a DVD player, or another electronic device. In particular, when the printed wiring board 1 is used in a DVD player, a mounting hole is provided for attaching a plastic base of the DVD device as a mounted member, and an insertion hole is provided for inserting a cable tie. Furthermore, the mounting hole and the insertion hole are formed joined together between an edge of the printed wiring board 1 and the mounting hole.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts.

While selected embodiments have been chosen to illustrate the present invention, it will be apparent to those skilled in the art from these disclosures that various changes and modifications can be made herein without departing from the scope of the invention as defined in the appended claims. Furthermore, the foregoing descriptions of the selected embodiments according to the present invention are provided for illustration only, and not for the purpose of limiting the invention as defined by the appended claims and their equivalents.

What is claimed is:

1. A printed wiring board comprising:
a board main body with an aperture, the aperture having a mounting hole portion and an insertion hole portion, the mounting hole portion being defined by a first edge on a rear face of the board main body, the insertion hole portion being defined by a second edge on the rear face of the board main body, the first and second edges forming a continuous peripheral edge of the aperture; and
a solder land disposed on the rear face of the board main body along the continuous peripheral edge of the aperture except for along a part of the second edge of the insertion hole portion,
the mounting hole portion of the board main body having a length measured in a first direction of the board main body, the length of the mounting hole portion being greater than a width of the mounting hole portion measured in a second direction of the board main body with the second direction being perpendicular to the first direction, the length of the mounting hole portion being greater than a dimension of the insertion hole portion measured in the first direction of the board main body, the insertion hole portion extending from a middle portion of the mounting hole portion in the first direction of the board main body towards a side edge of the board main body.

2. The printed wiring board according to claim 1, wherein
the mounting hole portion of the board main body is disposed adjacent to the side edge of the board main body, and
the insertion hole portion of the board main body is disposed between the mounting hole portion and the side edge of the board main body, the insertion hole portion being spaced apart from the side edge of the board main body by a distance that is at least equal to a thickness of the board main body.

3. The printed wiring board according to claim 1, wherein
the first edge of the rear face of the board main body defines an elongated opening as the mounting hole portion of the aperture, and
the second edge of the rear face of the board main body defines a square opening as the insertion hole portion of the aperture.

4. The printed wiring board according to claim 1, wherein
the mounting hole portion extends both sides of the insertion hole portion in the first direction of the board main body relative to the insertion hole portion.

5. An electronic device comprising:
a printed wiring board having an aperture with a continuous peripheral face, the aperture having a mounting hole portion and an insertion hole portion, the mounting hole portion being disposed adjacent to a side edge of the printed wiring board, the insertion hole portion being disposed between the mounting hole portion and the side edge of the printed wiring board, the insertion hole portion being spaced apart from the side edge of the printed wiring board by a distance that is at least equal to a thickness of the printed wiring board;
a mounted member disposed on the printed wiring board, the mounted member having a tab portion that is disposed through the mounting hole portion of the printed wiring board;
a wire electrically connected to the printed wiring board; and
a coupling member disposed through the insertion hole portion of the printed wiring board, the coupling member fixedly coupling the wire to the printed wiring board.

6. The electronic device according to claim 5, wherein
the coupling member includes a cable tie.

7. The electronic device according to claim 5, wherein
the mounted member includes a shield case, the tab portion of the mounted member being disposed on an end portion of the shield case.

8. The electronic device according to claim 5, wherein
the mounting hole portion is defined by a first edge on a rear face of the printed wiring board,
the insertion hole portion is defined by a second edge on the rear face of the printed wiring board, the first and second edges forming a continuous peripheral edge of the continuous peripheral face of the aperture, and
the printed wiring board further has a solder land that is disposed on the rear face of the printed wiring board along the continuous peripheral edge of the aperture except for along a part of the second edge of the insertion hole portion.

9. The electronic device according to claim 8, wherein
the tab portion of the mounted member is fixedly coupled to the printed wiring board with a solder that is applied between the solder land of the printed wiring board and the tab portion of the mounted member.

10. The electronic device according to claim 9, wherein
the mounted member includes a shield case, the tab portion of the mounted member being disposed on an end portion of the shield case.

11. The electronic device according to claim 8, wherein
the first edge of the rear face of the printed wiring board defines an elongated opening as the mounting hole portion of the aperture, and
the second edge of the rear face of the printed wiring board defines a square opening as the insertion hole portion of the aperture.

12. The electronic device according to claim 5, wherein
the mounting hole portion has a length measured in a first direction of the printed wiring board, the length of the mounting hole portion being greater than a width of the mounting hole portion measured in a second direction of the printed wiring board with the second direction being perpendicular to the first direction, the length of the mounting hole portion being greater than a dimension of the insertion hole portion measured in the first direction of the printed wiring board.

13. The electronic device according to claim 12, wherein
the insertion hole portion extends from a middle portion of the mounting hole portion in the first direction of the printed wiring board towards the side edge of the printed wiring board.

14. The electronic device according to claim 12, wherein
the insertion hole portion extends from an end portion of the mounting hole portion in the first direction of the printed wiring board towards the side edge of the printed wiring board.

* * * * *